(12) United States Patent
Kawamura

(10) Patent No.: US 8,232,806 B2
(45) Date of Patent: Jul. 31, 2012

(54) INSULATION STATE DETECTOR

(75) Inventor: Yoshihiro Kawamura, Makinohara (JP)

(73) Assignee: Yazaki Corporation, Tokyo (JP)

( * ) Notice: Subject to any disclaimer, the term of this patent is extended or adjusted under 35 U.S.C. 154(b) by 223 days.

(21) Appl. No.: 12/821,447

(22) Filed: Jun. 23, 2010

(65) Prior Publication Data

US 2011/0012606 A1 Jan. 20, 2011

(30) Foreign Application Priority Data

Jul. 15, 2009 (JP) ................................. 2009-166997

(51) Int. Cl.
*G01R 31/02* (2006.01)
(52) U.S. Cl. .................... 324/509; 324/503; 324/557
(58) Field of Classification Search .................. 324/503, 324/504, 509, 557; 361/42, 43
See application file for complete search history.

(56) References Cited

U.S. PATENT DOCUMENTS 4,178,617 A * 12/1979 Reichel ........................... 361/43
5,818,236 A   10/1998 Sone et al.

FOREIGN PATENT DOCUMENTS

JP   3224977 B2   8/2001

* cited by examiner

*Primary Examiner* — Vincent Q Nguyen
(74) *Attorney, Agent, or Firm* — Sughrue Mion, PLLC

(57) ABSTRACT

An insulation state detector detects an insulation state with respect to a ground potential portion of a DC power source on the basis of a charging voltage of a flying capacitor. The insulation state connector includes a detecting section that detects the insulation state of the DC power source by defining the charging voltage of the flying capacitor in the ground fault state as a charging voltage, in an unbalanced state where voltages across both ends of the positive-side Y capacitor and the negative-side Y capacitor are not equal to voltages obtained by dividing the voltage of the DC power source according to a voltage division ratio of the positive-side ground fault resistor and the negative-side ground fault resistor.

2 Claims, 5 Drawing Sheets

INSULATION STATE DETECTOR

BACKGROUND

The present invention relates to an insulation state detector which detects a ground fault or an insulation state with respect to a ground potential portion of a DC power source on the basis of a charging voltage of a flying capacitor charged by a DC power source insulated from the ground potential portion.

For example, in a vehicle which uses electric power as energy for propulsion, it is common to insulate a high-voltage (for example, 200 V) DC power source from the vehicle body. In addition, as an insulation state detector which detects a ground fault or an insulation state with respect to a ground potential portion of such a DC power source, a device that uses a flying capacitor charged by the DC power source is known in the related art. This kind of insulation state detector detects a ground fault or an insulation state of the DC power source by charging the flying capacitor with a charging voltage corresponding to the voltage of the DC power source or with a charging voltage corresponding to a ground fault resistor on the positive or negative side and measuring the charging voltage using a measuring unit, such as a microcomputer (for example, Patent Document 1).

Patent Document

[Patent Document 1] JP-B-3224977

In the DC power source described above, it is desirable to take measures against high-frequency noise. For this reason, a Y capacitor is provided between each of two electrodes of the DC power source and the ground potential portion so that an electric charge charged in the Y capacitor is discharged when charging the flying capacitor and the flying capacitor is charged accordingly. Therefore, when detecting the ground fault or the insulation state of the DC power source from the charging voltage of the flying capacitor, it is necessary to consider the amount of charging in the flying capacitor based on the discharged electric charge of the Y capacitor.

The amount of charging in the flying capacitor based on the discharged electric charge of the Y capacitor is not constant but changes according to the balance of a positive-side ground fault resistor and a negative-side ground fault resistor at that time. Accordingly, it was very difficult to formulate the amount of charging in the flying capacitor based on the discharged electric charge of the Y capacitor with a parameter corresponding to the balance of the positive-side ground fault resistor and the negative-side ground fault resistor at that time.

SUMMARY

The invention has been made in view of the above situation, and it is an object of the invention to provide an insulation state detector capable of precisely detecting a ground fault or an insulation state of a DC power source on the basis of the charging voltage of a flying capacitor even if the amount of charging in the flying capacitor based on a discharged electric charge of a Y capacitor changes according to the balance of a positive-side ground fault resistor and a negative-side ground fault resistor when charging the flying capacitor.

In order to achieve the above object, according to the present invention, there is provided an insulation state detector for detecting an insulation state with respect to a ground potential portion of a DC power source, in which a positive-side Y capacitor is provided between the ground potential portion and a positive electrode of the DC power source and a negative-side Y capacitor is provided between the ground potential portion and a negative electrode of the DC power source, on the basis of a charging voltage of a flying capacitor, which is charged by the DC power source, in a state that the DC power source is insulated from the ground potential portion and a charging voltage of the flying capacitor, which is charged by the DC power source and the Y capacitors, in a ground fault state where one of the positive and negative electrodes of the DC power source is connected to the ground potential portion by a positive-side ground fault resistor or a negative-side ground fault resistor, the insulation state connector comprising:

a detecting section that detects an insulation state of the DC power source by defining the charging voltage of the flying capacitor in the ground fault state as a charging voltage based on the Y capacitors and the DC power source in the case that the Y capacitors have assumed capacitances different from actual capacitances of the Y capacitors, in an unbalanced state where voltages across both ends of the positive-side Y capacitor and the negative-side Y capacitor are not equal to voltages obtained by dividing the voltage of the DC power source according to a voltage division ratio of the positive-side ground fault resistor and the negative-side ground fault resistor.

By the above configuration, even if in the unbalanced state where the voltages across both ends of the Y capacitors on the positive and negative sides are not equal to the voltages obtained by dividing the voltage of the DC power source according to the voltage division ratio of the positive-side ground fault resistor and the negative-side ground fault resistor, the insulation state of the DC power source can be detected by the detecting section on the basis of the charging voltage, which is based on the DC power source and the Y capacitors in the ground fault state and the insulation state of the flying capacitor, only by setting the capacitances of the Y capacitors to assumed capacitances which are different from the actual capacitances.

As a result, the insulation state of the DC power source can be detected by fixed expression regardless of whether or not the voltages across both ends of the Y capacitors are in a balanced state of being equal to the voltages obtained by dividing the voltage of the DC power source according to the voltage division ratio of the positive-side ground fault resistor and the negative-side ground fault resistor.

Preferably, the detecting section detects the insulation state of the DC power source on the basis of the charging voltage of the flying capacitor in the ground fault state where the flying capacitor is connected to the ground potential portion by the positive-side ground fault resistor, the charging voltage of the flying capacitor in the ground fault state where the flying capacitor is connected to the ground potential portion by the negative-side ground fault resistor, and the charging voltage of the flying capacitor in the insulation state, wherein the assumed capacitances of the Y capacitors are greater than the actual capacitances of the Y capacitors.

By the above configuration, it is set that the assumed capacitances of the Y capacitors are greater than the actual capacitances of the Y capacitors. The insulation state of the DC power source can also be correctly detected using fixed expression on the basis of each charging voltage in the ground fault state of the flying capacitor based on each of the ground fault resistors on the positive and negative sides and the charging voltage of the flying capacitor in the insulation state when the voltages across both ends of the Y capacitors are in the unbalanced state.

According to the insulation state detector of the invention, the ground fault or the insulation state of the DC power source can be correctly detected on the basis of the charging voltage of the flying capacitor.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF EXEMPLARY EMBODIMENTS

Hereinafter, an embodiment of an insulation state detector of the invention will be described with reference to the accompanying drawings.

Figure 1:
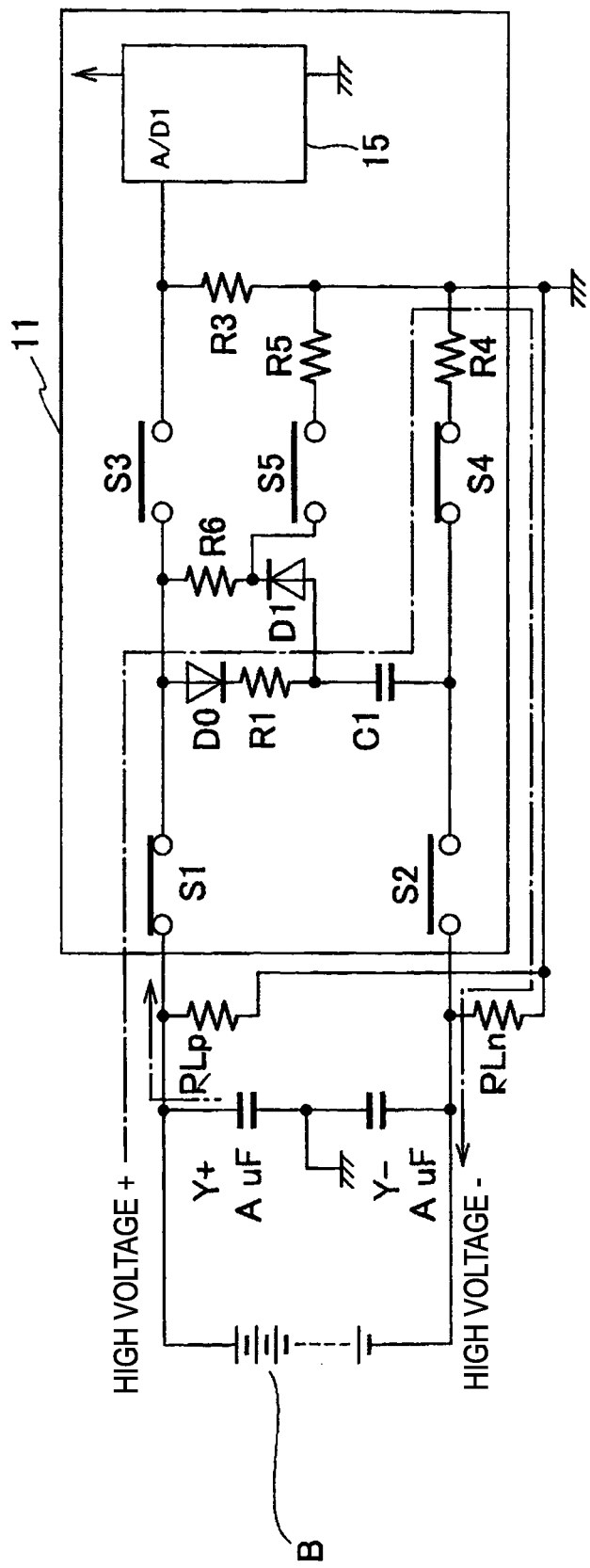
FIG. 1 is a circuit diagram showing a ground fault sensor according to an embodiment of the invention.

FIG. 1 is a circuit diagram showing a ground fault sensor according to an embodiment of the invention. In FIG. 1, a ground fault sensor denoted by reference numeral 11 serves to detect an insulation state of a high-voltage DC power source B insulated from a ground potential portion. In addition, in FIG. 1, reference numeral RLp denotes a ground fault resistor on the positive side of the high-voltage DC power source B, and RLn denotes a ground fault resistor on the negative side similarly.

The ground fault sensor 11 (equivalent to an insulation state detector) has a flying capacitor C1 with two polarities and switches S1 to S5. The switches S1 and S2 selectively connect two electrodes of the flying capacitor C1 to positive and negative electrodes of the high-voltage DC power source B, respectively. The switches S3 and S4 selectively connect the two electrodes of the flying capacitor C1 to a microcomputer 15 and the ground potential portion, respectively. The switch S5 selectively connects (selectively grounds) one electrode (in FIG. 1, an upper electrode) of the flying capacitor C1 to the ground potential portion through a diode D1 for discharge.

Since the micro computer 15 (equivalent to a measuring section) operates by a low-voltage auxiliary battery which is lower than the high-voltage DC power source B, the high-voltage DC power source B is also insulated from the ground potential of the micro computer 15. Each of the switches S1 to S5 is formed of an optical MOSFET, for example, and is insulated from the high-voltage DC power source B so that it can be on/off controlled by the micro computer 15.

A connection point between the micro computer 15 and the switch S3 is grounded through a resistor R3, and a resistor R4 is connected between the switch S4 and the ground potential portion and a resistor R5 is connected between the switch S5 and the ground potential portion. The switches S1 and S3 located at the one end side of the flying capacitor C1 are connected in series to each other, a current direction switching circuit is connected between a connection point of the switches S1 and S3 and the one end of the flying capacitor C1.

The current direction switching circuit is a parallel circuit. One side of the current direction switching circuit is formed by a series circuit of a diode D0, which has a forward direction from the switches S1 and S3 toward the one end of the flying capacitor C1, and a resistor R1. The other side of the current direction switching circuit is formed by a series circuit of a diode D1, which has a forward direction from the one end of the flying capacitor C1 toward the switches S1 and S3, and a resistor R6.

In the ground fault sensor 11 of the present embodiment described above, both electrodes of the flying capacitor C1 are selectively connected to an ND conversion port A/D1 of the micro computer 15 by the switches S3 and S4, respectively.

In addition, in the high-voltage DC power source B of the present embodiment, Y capacitors Y+ and Y− against common-mode noise are provided between positive and negative electrodes and the ground potential portion, respectively.

In the ground fault sensor 11 configured as described above, first of all, the switches S1 and S2 are turned on while the switches S3 to S5 are turned off by control of the micro computer 15 when detecting a ground fault or an insulation state. As a result, a charging circuit ranging from the positive electrode of the high-voltage DC power source B to the negative electrode of the high-voltage DC power source B through the switch S1, the diode D0, the resistor R1, one and the other ends of the flying capacitor C1, and the switch S2 is formed. In addition, in the charging circuit, the flying capacitor C1 is charged with the charge amount corresponding to the voltage of the high-voltage DC power source B. By this charging, one end of the flying capacitor C1 becomes a positive electrode and the other end of the flying capacitor C1 becomes a negative electrode.

Then, the switches S3 and S4 are turned on while the switches S1, S2, and S5 are turned off by control of the micro computer 15. As a result, the flying capacitor C1 is connected in parallel to a series circuit of the resistor R6, the resistor R3, and the resistor R4. Then, an electric potential, which is equivalent to the difference between voltages of both ends of the resistor R3, when the charging voltage of the flying capacitor C1 is divided by the resistors R6, R3, and R4 is input to the first ND conversion port A/D1 of the micro computer 15 and is measured. From the measured value and the voltage division ratio of the resistors R6, R3, and R4, the charging voltage of the flying capacitor C1 is measured by the micro computer 15. Accordingly, in the present embodiment, a measuring circuit is formed by the diode D1, the resistor R6, the switch S3, the resistor R3, the switch S4, and the resistor R4.

In addition, by control of the micro computer 15, the switch S5 is turned on and the other switches S1 to S4 are turned off. In this case, since one end (positive electrode) of the flying capacitor C1 is grounded through the diode D1, the switch S5, and the resistor R5, a discharging circuit is formed. Then, the flying capacitor C1 is discharged by the discharging circuit.

Then, the switches S1 and S4 are turned on while the switches S2, S3, and S5 are turned off by control of the micro computer 15. As a result, as shown in FIG. 1, a charging circuit ranging from the positive electrode of the high-voltage DC power source B to the negative electrode of the high-voltage DC power source B through the switch S1, the diode D0, the resistor R1, one and the other ends of the flying capacitor C1, the switch S4, the resistor R4, the (ground potential portion), and the negative-side ground fault resistor RLn is formed. In addition, in this charging circuit, the flying capacitor C1 is charged with the charge amount corresponding to the negative-side ground fault resistor RLn. By this charging, one end of the flying capacitor C1 becomes a positive electrode and the other end of the flying capacitor C1 becomes a negative electrode.

Then, the switches S1, S2, and S5 are turned off while the switches S3 and S4 are turned on by control of the micro computer 15, such that the same measuring circuit as when measuring the charging voltage of the flying capacitor C1 corresponding to the voltage of the high-voltage DC power source B is formed. Then, using this measuring circuit, the charging voltage of the flying capacitor C1 is measured by the micro computer 15.

In addition, by control of the micro computer 15, the switch S5 is turned on and the other switches S1 to S4 are turned off. In this case, since one end (positive electrode) of the flying capacitor C1 is grounded through the diode D1, the switch S5, and the resistor R5, a discharging circuit is formed. Then, the flying capacitor C1 is discharged by the discharging circuit.

Figure 2:
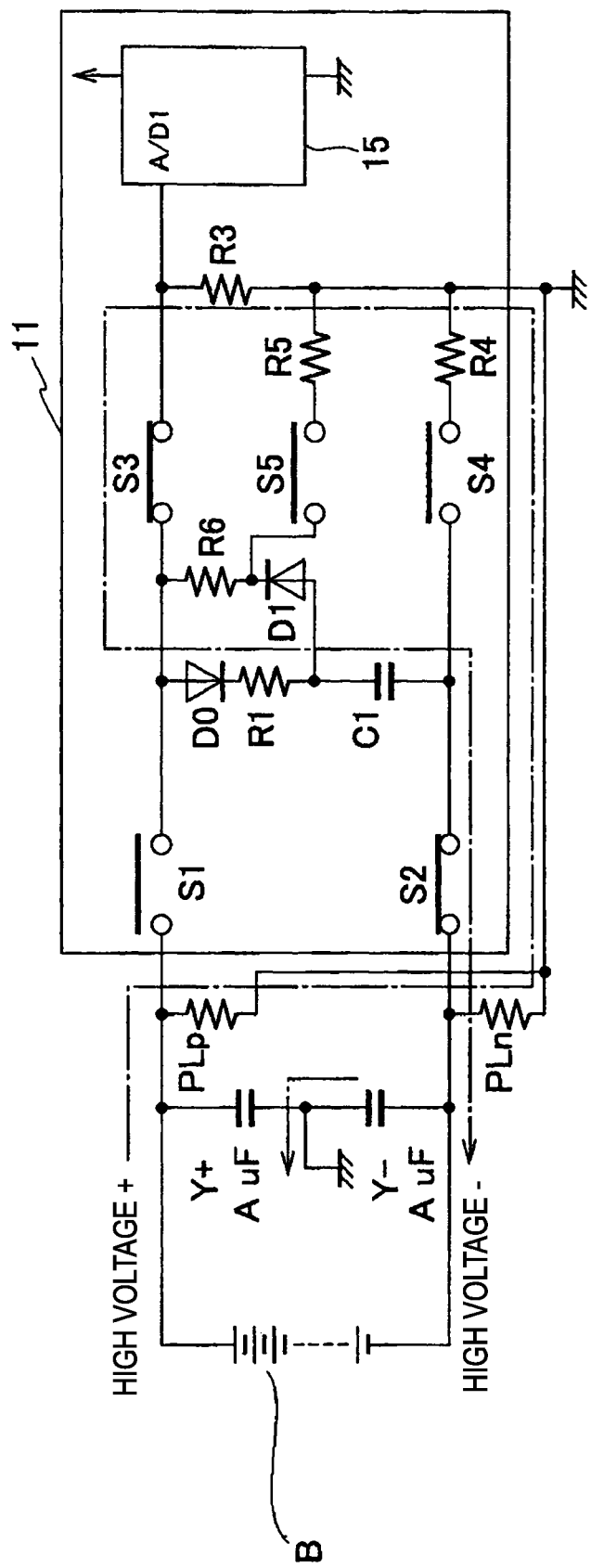
FIG. 2 is a circuit diagram showing a charging circuit formed when charging a flying capacitor according to a positive-side ground fault resistor by the ground fault sensor shown in FIG. 1.

Then, the switches S2 and S3 are turned on while the switches S1, S4, and S5 are turned off by control of the micro computer 15. As a result, as shown in FIG. 2, a charging circuit ranging from the positive electrode of the high-voltage DC power source B to the negative electrode of the high-voltage DC power source B through the positive-side ground fault resistor RLp, the (ground potential portion), the switch S3, the diode D0, the resistor R1, one and the other ends of the flying capacitor C1, and the switch S2 is formed. In addition, in this charging circuit, the flying capacitor C1 is charged with the charge amount corresponding to the positive-side ground fault resistor RLp. By this charging, one end of the flying capacitor C1 becomes a positive electrode and the other end of the flying capacitor C1 becomes a negative electrode.

Then, the switches S1, S2, and S5 are turned off while the switches S3 and S4 are turned on by control of the micro computer 15, such that the same measuring circuit as when measuring the charging voltage of the flying capacitor C1 corresponding to the voltage of the high-voltage DC power source B or when measuring the charging voltage of the flying capacitor C1 corresponding to the negative-side ground fault resistor RLn is formed. Then, using this measuring circuit, the charging voltage of the flying capacitor C1 is measured by the micro computer 15.

In addition, by control of the micro computer 15, the switch S5 is turned on and the other switches S1 to S4 are turned off. In this case, since one end (positive electrode) of the flying capacitor C1 is grounded through the diode D1, the switch S5, and the resistor R5, a discharging circuit is formed. Then, the flying capacitor C1 is discharged by the discharging circuit.

Here, the following relational expression 1) is satisfied among a charging voltage Vc1 of the flying capacitor C1 corresponding to the voltage of the high-voltage DC power source B, a charging voltage Vc1− of the flying capacitor C1 corresponding to the negative-side ground fault resistor RLn, a charging voltage Vc1+ of the flying capacitor C1 corresponding to the positive-side ground fault resistor RLp, and a parallel combined resistance value $R=(RLp+RLn)/(RLp \times RLn)$ of the positive-side ground fault resistor RLp and the negative-side ground fault resistor RLn.

$$(RLp+RLn)/(RLp \times RLn) = \{(Vc1+)+(Vc1-)\}/Vc1 \quad 1)$$

Accordingly, the microcomputer 15 can calculate the parallel combined resistance value of the ground fault resistors RLp and RLn on the positive and negative sides using the above relational expression and can detect the ground fault or the insulation state of the high-voltage DC power source B.

On the other hand, in the present embodiment, the Y capacitors Y+ and Y− are provided between the positive and negative electrodes of the high-voltage DC power source B and the ground potential portion, respectively. The Y capacitors Y+ and Y− are charged by the high-voltage DC power source B.

In addition, when charging the flying capacitor C1 with the charge amount corresponding to the negative-side ground fault resistor RLn, an electric charge charged in the Y capacitor Y+ on the positive side is discharged. As a result, electric charges including the charged electric charge, which is discharged, are charged in the flying capacitor C1.

In addition, when charging the flying capacitor C1 with the charge amount corresponding to the positive-side ground fault resistor RLp, an electric charge charged in the Y capacitor Y− on the negative side is discharged. As a result, electric charges including the charged electric charge, which is discharged, are charged in the flying capacitor C1.

Accordingly, the amount of charged electric charges discharged from the Y capacitor Y+ or Y− on the positive or negative side is included in the charging voltage Vc1− of the flying capacitor C1 corresponding to the negative-side ground fault resistor RLn or the charging voltage Vc1+ of the flying capacitor C1 corresponding to the positive-side ground fault resistor RLp, which is measured by the microcomputer 15 of the ground fault sensor 11 of the present embodiment.

That is, the charging voltage of the flying capacitor C1 measured by the microcomputer 15 of the ground fault sensor 11 becomes a value which is higher than the charging voltage Vc1− of the flying capacitor C1 corresponding to the negative-side ground fault resistor RLn or the charging voltage Vc1+ corresponding to the positive-side ground fault resistor RLp by the amount of charged electric charges discharged from the Y capacitor Y+ or Y− on the positive or negative side. Accordingly, if the parallel combined resistance value of the positive-side ground fault resistor RLp and the negative-side ground fault resistor RLn is calculated by the relational expression described above, the value offset to be lower than the actual resistance value is calculated.

Therefore, the microcomputer 15 of the present embodiment calculates the value obtained by subtracting a voltage, which corresponds to the amount of charging based on the discharged electric charge of the Y capacitor Y+ on the positive side, from the charging voltage of the flying capacitor C1, which is measured as the value corresponding to the negative-side ground fault resistor RLn, as a true value of the charging voltage Vc1− of the flying capacitor C1 corresponding to the negative-side ground fault resistor RLn. In addition, the microcomputer 15 calculates the value obtained by subtracting a voltage, which corresponds to the amount of charging based on the discharged electric charge of the Y capacitor Y− on the negative side, from the charging voltage of the flying capacitor C1, which is measured as the value corresponding to the positive-side ground fault resistor RLp, as a true value of the charging voltage Vc1+ of the flying capacitor C1 corresponding to the positive-side ground fault resistor RLp. In addition, the microcomputer 15 calculates the parallel combined resistance value of the positive-side ground fault resistor RLp and the negative-side ground fault resistor RLn by performing calculation of the relational expression 1) using the true values of the charging voltages Vc1+ and Vc1− of the flying capacitor C1, which correspond to the calculated ground fault resistors RLp and RLn on the positive and negative sides, and detects the ground fault or the insulation state of the high-voltage DC power source B. In addition, the charging voltages based on the discharged electric charges of the Y capacitors Y+ and Y− on the positive and negative sides can be acquired by calculation if the capacities of the Y capacitors Y+ and Y− on the positive and negative sides are known.

However, the amount of charged electric charges discharged from the Y capacitor Y+ or Y− on the positive or negative side, which is included in the charging voltage Vc1− of the flying capacitor C1 corresponding to the negative-side ground fault resistor RLn or the charging voltage Vc1+ of the flying capacitor C1 corresponding to the positive-side ground fault resistor RLp, is not always a fixed value but changes according to the situation. Hereinafter, the situation will be described with reference to FIGS. 3 and 4.

First, in the initial stage, the voltages at both ends of the Y capacitors Y+ and Y− on the positive and negative sides are voltages obtained by dividing the voltage of the high-voltage DC power source B by the voltage-divided resistance ratio in a series circuit of the positive-side ground fault resistor RLp and the negative-side ground fault resistor RLn. Accordingly, in the initial stage, the electric potential at the connection point of the Y capacitors Y+ and Y− on the positive and negative sides is equal to the electric potential (GND potential) of the ground potential portion (point of time of (1) in FIG. 3).

Figure 3:
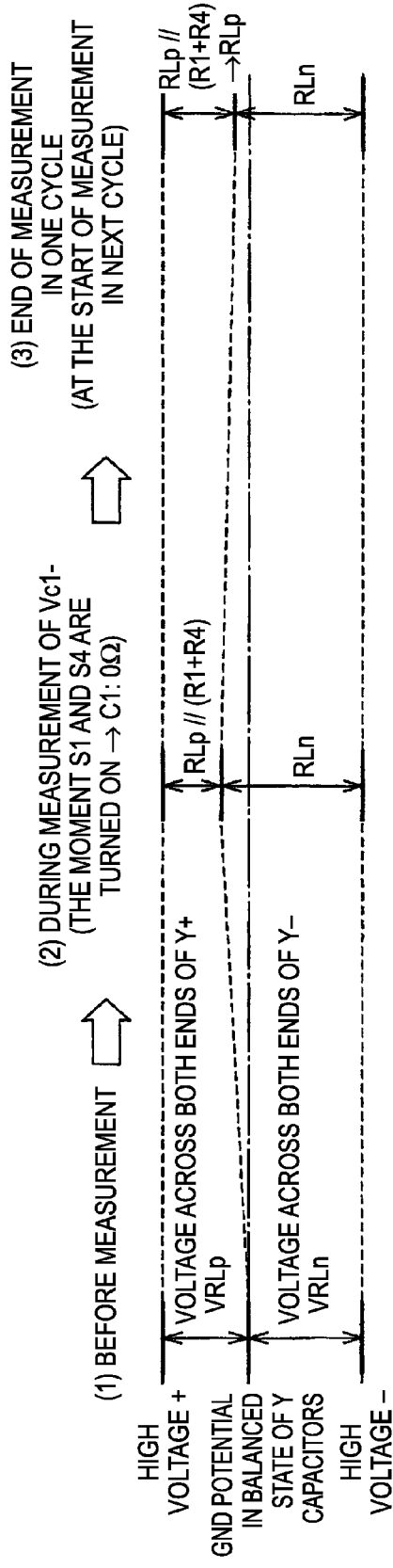
FIG. 3 is an explanatory view showing the situation where the charging voltage of a flying capacitor measured by the ground fault sensor shown in FIG. 1 changes.

However, for example, as shown at the point of time of (2) in FIG. 3, the Y capacitor Y+ on the positive side discharges the charged electric charge the moment the flying capacitor C1 is charged with the charge amount corresponding to the negative-side ground fault resistor RLn. Then, a voltage across both ends of the Y capacitor Y+ on the positive side drops. Accordingly, the electric potential at the connection point of the Y capacitors Y+ and Y− on the positive and negative side rises above the electric potential (GND potential) of the ground potential portion.

Then, since the Y capacitor Y+ on the positive side is charged again by the high-voltage DC power source B, the increased electric potential at the connection point of the Y capacitors Y+ and Y− on the positive and negative sides drops. Accordingly, if a time which is long to some extent is ensured in charging of the flying capacitor C1 corresponding to the negative-side ground fault resistor RLn or an idle time, for which neither charging and discharging of the flying capacitor C1 nor measurement of the charging voltage is performed, is sufficiently ensured after discharging of the flying capacitor C1, the increased electric potential at the connection point of the Y capacitors Y+ and Y− on the positive and negative sides returns to the original electric potential (GND potential) of the ground potential portion.

However, if the charging time of the flying capacitor C1 corresponding to the negative-side ground fault resistor RLn is increased or the sufficient idle time is ensured after discharging of the flying capacitor C1, a period of time, for which there is a possibility of electric shock caused by the high voltage of the high-voltage DC power source B, increases. Therefore, those described above are difficult to realize for safety reason. For this reason, as shown at the point of time of (3) in FIG. 3, before the electric potential at the connection point of the Y capacitors Y+ and Y− on the positive and negative sides returns to the original electric potential (GND potential) of the ground potential portion, charging of the flying capacitor C1 corresponding to the positive-side ground fault resistor RLp which is the next step should be started.

Figure 4:
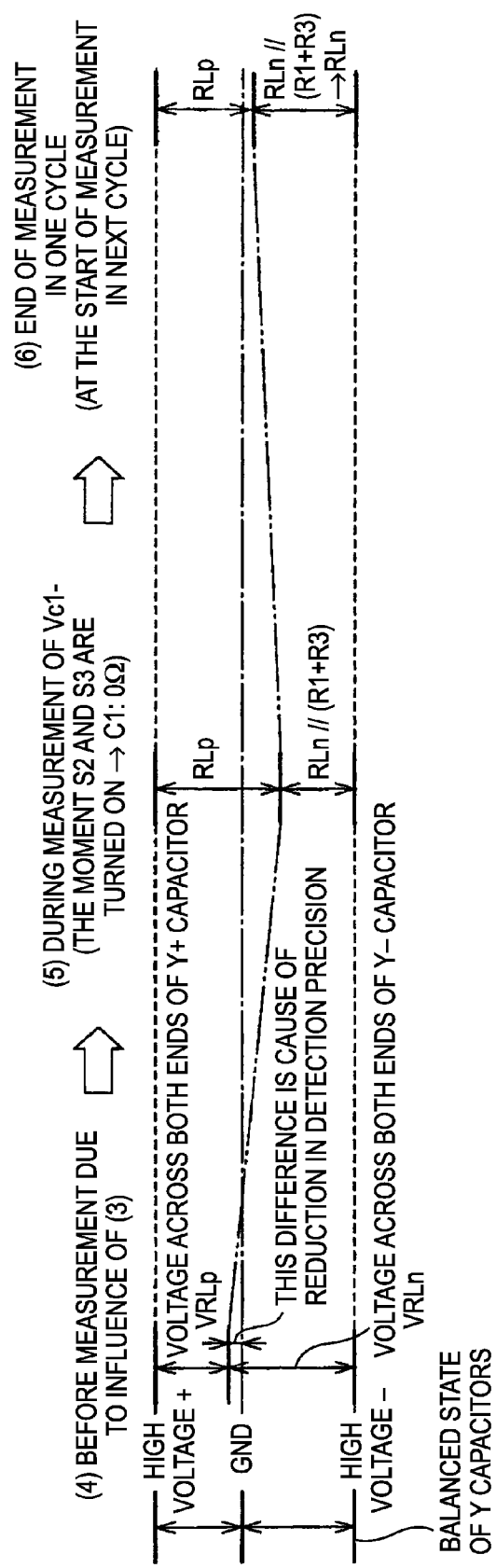
FIG. 4 is an explanatory view showing the situation where the charging voltage of a flying capacitor measured by the ground fault sensor shown in FIG. 1 changes.

Accordingly, as shown at the point of time of (1) in FIG. 4, the flying capacitor C1 starts to be charged with the charge amount corresponding to the positive-side ground fault resistor RLp in a state where the electric potential at the connection point of the Y capacitors Y+ and Y− on the positive and negative sides is higher than the electric potential (GND potential) of the ground potential portion.

For this reason, the moment the flying capacitor C1 starts to be charged with the charge amount corresponding to the positive-side ground fault resistor RLp, the amount of charged electric charge discharged from the Y capacitor Y− on the negative side is different from (smaller than) that in the case where the electric potential at the connection point of the Y capacitors Y+ and Y− on the positive and negative sides is equal to the electric potential (GND potential) of the ground potential portion.

Accordingly, the amount of charged electric charge discharged from the Y capacitor Y− on the negative side, which is included in the charging voltage Vc1+ of the flying capacitor C1 corresponding to the positive-side ground fault resistor RLp measured by the microcomputer 15, is different depending on whether or not the electric potential at the connection point of the Y capacitors Y+ and Y− on the positive and negative sides is equal to the electric potential (GND potential) of the ground potential portion. In addition, when the electric potential at the connection point of the Y capacitors Y+ and Y− on the positive and negative sides is not equal to the electric potential (GND potential) of the ground potential portion, the amount of charged electric charge discharged from the Y capacitor Y− on the negative side is different depending on how much it deviates from the electric potential (GND potential) of the ground potential portion. Eventually, the microcomputer 15 cannot calculate the parallel combined resistance value of the ground fault resistors RLp and RLn on the positive and negative sides correctly only by measuring the charging voltage of the flying capacitor C1.

In addition, as shown at the point of time of (2) in FIG. 4, the Y capacitor Y− on the negative side discharges the charged electric charge the moment the flying capacitor C1 is charged with the charge amount corresponding to the positive-side ground fault resistor RLp. Then, a voltage across both ends of the Y capacitor Y− on the negative side drops. Accordingly, the electric potential at the connection point of the Y capacitors Y+ and Y− on the positive and negative side drops below the electric potential (GND potential) of the ground potential portion.

Then, since the Y capacitor Y− on the negative side is charged again by the high-voltage DC power source B, the decreased electric potential at the connection point of the Y capacitors Y+ and Y− on the positive and negative sides rises. Accordingly, if a time which is long to some extent is ensured in charging of the flying capacitor C1 corresponding to the positive-side ground fault resistor RLp or an idle time, for which neither charging and discharging of the flying capacitor C1 nor measurement of the charging voltage is performed, is sufficiently ensured after discharging of the flying capacitor C1, the decreased electric potential at the connection point of the Y capacitors Y+ and Y− on the positive and negative sides returns to the original electric potential (GND potential) of the ground potential portion.

However, if the charging time of the flying capacitor C1 corresponding to the positive-side ground fault resistor RLp is increased or the sufficient idle time is ensured after discharging of the flying capacitor C1, a period of time, for which there is a possibility of electric shock caused by the high voltage of the high-voltage DC power source B, increases. Therefore, those described above are difficult to realize for safety reason. For this reason, as shown at the point of time of (3) in FIG. 4, before the electric potential at the connection point of the Y capacitors Y+ and Y− on the positive and negative sides returns to the original electric potential (GND potential) of the ground potential portion, charging of the flying capacitor C1 corresponding to the negative-side ground fault resistor RLn which is the next step should be started.

Accordingly, the flying capacitor C1 starts to be charged with the charge amount corresponding to the negative-side ground fault resistor RLn in a state where the electric potential at the connection point of the Y capacitors Y+ and Y− on the positive and negative sides is higher than the electric potential (GND potential) of the ground potential portion.

Therefore, subsequently, the amount of charged electric charges discharged from the Y capacitor Y+ on the positive side, which is included in the charging voltage Vc1− of the flying capacitor C1 corresponding to the negative-side ground fault resistor RLn measured by the microcomputer 15, or the amount of charged electric charges discharged from the Y capacitor Y− on the negative side, which is included in the charging voltage Vc1+ of the flying capacitor C1 corresponding to the positive-side ground fault resistor RLp, is always different. For this reason, the microcomputer 15 cannot calculate the parallel combined resistance value of the ground fault resistors RLp and RLn on the positive and negative sides correctly only by measuring the charging voltage of the flying capacitor C1.

Therefore, the microcomputer 15 of the ground fault sensor 11 of the present embodiment calculates the charging voltage based on the discharged electric charges of the Y capacitors Y+ and Y− on the positive and negative sides by regarding the capacitances of the Y capacitors Y+ and Y− on the positive and negative sides as assumed capacitances which are different from the actual capacitances. In addition, the microcomputer 15 calculates the true values of the charging voltages Vc1+ and Vc1− of the flying capacitor C1 corresponding to the positive-side ground fault resistor RLp or the negative-side ground fault resistor RLn by subtracting the calculated charging voltages of the Y capacitors Y+ and Y− on the positive and negative sides from the charging voltage of the flying capacitor C1 measured as a value corresponding to the positive-side ground fault resistor RLp or the negative-side ground fault resistor RLn. In addition, the microcomputer 15 calculates the parallel combined resistance value of the ground fault resistors RLp and RLn on the positive and negative sides using the true values, such that the ground fault or the insulation state of the high-voltage DC power source B can be detected.

Specifically, the microcomputer 15 of the present embodiment calculates the charging voltage based on the discharged electric charges of the Y capacitors Y+ and Y− on the positive and negative sides by regarding (setting) the capacitances of the Y capacitors Y+ and Y− on the positive and negative sides as capacitances, which are obtained by multiplying the actual capacitances by a predetermined coefficients. Using this, the microcomputer 15 of the present embodiment calculates the true values of the charging voltages Vc1+ and Vc1− of the flying capacitor C1 corresponding to the positive-side ground fault resistor RLp or the negative-side ground fault resistor RLn and calculates the parallel combined resistance value of the ground fault resistors RLp and RLn on the positive and negative sides. In addition, the predetermined coefficient (in the present embodiment, 1.2 times the actual capacitance) referred to herein may be calculated experimentally.

Figure 5:
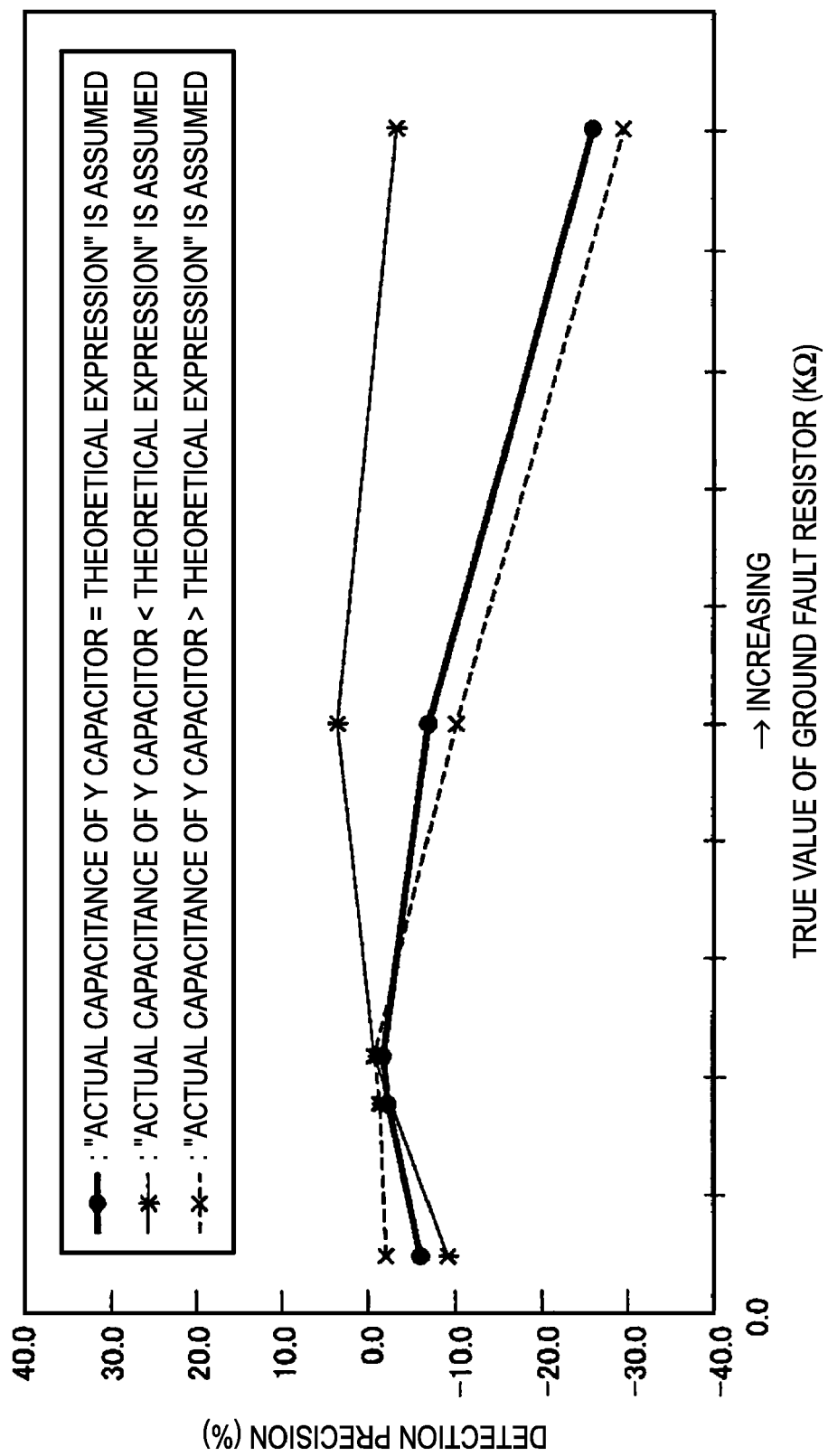
FIG. 5 is a graph showing the correlation of precision of the parallel combined resistance value of ground fault resistors on the positive and negative sides, which is calculated by the ground fault sensor shown in FIG. 1, with respect to the parallel combined resistance value (true value) of ground fault resistors on the positive and negative sides.

FIG. 5 is a graph showing the correlation of precision (error) of the parallel combined resistance value of the ground fault resistors RLp and RLn on the positive and negative sides, which is calculated by the microcomputer 15 of the ground fault sensor 11 of the present embodiment, with respect to the parallel combined resistance value (true value) of ground fault resistors on the positive and negative sides. In this graph, a thick solid line indicates the correlation when the capacitances of the Y capacitors Y+ and Y− on the positive and negative sides are set to the same values as the actual capacitances. In addition, a thin solid line indicates the correlation when the capacitances of the Y capacitors Y+ and Y− on the positive and negative sides are set to the values (1.2 times the actual capacitances) larger than the actual capacitances. In addition, a dotted line indicates the correlation when the capacitances of the Y capacitors Y+ and Y− on the positive and negative sides are set to the values (0.8 times the actual capacitances) smaller than the actual capacitances.

As is also apparent from the graph shown in FIG. 5, in the case where the capacitances of the Y capacitors Y+ and Y− on the positive and negative sides are set to the values (1.2 times the actual capacitances) larger than the actual capacitances, the precision (error over the true value) of the parallel combined resistance value of the ground fault resistors RLp and RLn on the positive and negative sides calculated by the microcomputer 15, which is shown on the vertical axis, has a good value in most of the region on the horizontal axis, which indicates the true value of the parallel combined resistance value of the ground fault resistors RLp and RLn on the positive and negative sides, compared with the case where the capacitances of the Y capacitors Y+ and Y− on the positive and negative sides are set to the actual capacitances or the case where the capacitances of the Y capacitors Y+ and Y− on the positive and negative sides are set to the capacitances smaller than the actual capacitances.

Moreover, for example, in the case of outputting an alarm indicating the defect of an insulation state or a ground fault of the high-voltage DC power source B when the parallel combined resistance value of the ground fault resistors RLp and RLn on the positive and negative sides calculated by the microcomputer 15 of the ground fault sensor 11 is within a certain range, it is preferable that the microcomputer 15 determines the assumed capacitances of the Y capacitors Y+ and Y− on the positive and negative sides as values, at which the precision of the parallel combined resistance value of the ground fault resistors RLp and RLn on the positive and negative sides calculated by the microcomputer 15 becomes the best.

For example, in the case where the microcomputer 15 outputs an alarm when the parallel combined resistance value of the ground fault resistors RLp and RLn on the positive and negative sides is in a range from the origin to the second gradation on the horizontal axis of the graph in FIG. 5, the capacitances of the Y capacitors Y+ and Y− on the positive and negative sides may also be regarded as assumed capacitances smaller than the actual capacitances, contrary to the case of the present embodiment.

According to the ground fault 11 of the present embodiment configured as described above, the parallel combined resistance value of the ground fault resistors RLp and RLn on the positive and negative sides is correctly calculated without waiting until the electric potential at the connection point of the Y capacitors Y+ and Y− on the positive and negative sides, which changes by discharging of the Y capacitor Y+ on the positive side or the Y capacitor Y− on the negative side at the start of charging, returns to the original electric potential (GND potential) of the ground potential portion by increasing the charging time of the flying capacitor C1 corresponding to the ground fault resistor RLp or RLn on the positive or negative side. As a result, the ground fault or the insulation state of the high-voltage DC power source B can be detected with high precision.

In addition, since it is not necessary to continue charging of the flying capacitor C1 corresponding to the ground fault resistor RLp or RLn on the positive or negative side until the electric potential at the connection point of the Y capacitors Y+ and Y− on the positive and negative sides returns to the original electric potential (GND potential) of the ground potential portion, it is possible to realize the detection of ground fault or insulation state of the high-voltage DC power source B, which is very safe by short-time charging.

In addition, even if the Y capacitors Y+ and Y− on the positive and negative sides exist, the parallel combined resistance value of the ground fault resistors RLp and RLn on the positive and negative sides can be correctly calculated. Accordingly, without caring about the influence on detection precision of the ground fault or the insulation state of the high-voltage DC power source B, it is possible to take sufficient measures against common-mode noise for the high-voltage DC power source B using capacitors with high capacitance for the Y capacitors Y+ and Y−.

The invention is suitable when detecting a ground fault or an insulation state of a DC power source with respect to a ground potential portion on the basis of the charging voltage of a flying capacitor charged by the DC power source insulated from the ground potential portion.

Although the invention has been illustrated and described for the particular preferred embodiments, it is apparent to a person skilled in the art that various changes and modifications can be made on the basis of the teachings of the invention. It is apparent that such changes and modifications are within the spirit, scope, and intention of the invention as defined by the appended claims.

The present application is based on Japanese Patent Application No. 2009-166997 filed on Jul. 15, 2009, the contents of which are incorporated herein by reference.

What is claimed is:

1. An insulation state detector for detecting an insulation state with respect to a ground potential portion of a DC power source, in which a positive-side Y capacitor is provided between the ground potential portion and a positive electrode of the DC power source and a negative-side Y capacitor is provided between the ground potential portion and a negative electrode of the DC power source, on the basis of a charging voltage of a flying capacitor, which is charged by the DC power source, in a state that the DC power source is insulated from the ground potential portion and a charging voltage of the flying capacitor, which is charged by the DC power source and the Y capacitors, in a ground fault state where one of the positive and negative electrodes of the DC power source is connected to the ground potential portion by a positive-side ground fault resistor or a negative-side ground fault resistor, the insulation state connector comprising:

a detecting section that detects the insulation state of the DC power source by defining the charging voltage of the flying capacitor in the ground fault state as a charging voltage based on the Y capacitors and the DC power source in the case that it is set that the Y capacitors have assumed capacitances different from actual capacitances of the Y capacitors, in an unbalanced state where voltages across both ends of the positive-side Y capacitor and the negative-side Y capacitor are not equal to voltages obtained by dividing the voltage of the DC power source according to a voltage division ratio of the positive-side ground fault resistor and the negative-side ground fault resistor.

2. The insulation state detector according to claim 1, wherein the detecting section detects the insulation state of the DC power source on the basis of the charging voltage of the flying capacitor in the ground fault state where the flying capacitor is connected to the ground potential portion via the positive-side ground fault resistor, the charging voltage of the flying capacitor in the ground fault state where the flying capacitor is connected to the ground potential portion via the negative-side ground fault resistor, and the charging voltage of the flying capacitor in the insulation state; and wherein the assumed capacitances of the Y capacitors are greater than the actual capacitances of the Y capacitors.

* * * * *